United States Patent [19]
Sarkar et al.

[11] Patent Number: 5,848,089
[45] Date of Patent: Dec. 8, 1998

[54] EXCIMER LASER WITH MAGNETIC BEARINGS SUPPORTING FAN

[75] Inventors: Kamal Sarkar; Richard C. Ujazdowski, both of San Diego; Palash P. Das, Vista; Donald G. Larson, Encinitas, all of Calif.

[73] Assignee: Cymer, Inc., San Diego, Calif.

[21] Appl. No.: 893,904

[22] Filed: Jul. 11, 1997

[51] Int. Cl.$^6$ .................................................. H01S 3/225
[52] U.S. Cl. ................................ 372/58; 372/57; 372/98
[58] Field of Search ............................... 375/55–60, 98, 375/109

[56] References Cited

U.S. PATENT DOCUMENTS

| | | | |
|---|---|---|---|
| 4,891,818 | 1/1990 | Levatter | 372/57 |
| 4,959,840 | 9/1990 | Akins et al. | 372/57 |
| 5,023,884 | 6/1991 | Akins et al. | 372/57 |
| 5,727,011 | 3/1998 | Choo et al. | 372/58 |
| 5,770,933 | 6/1998 | Larson et al. | 372/58 X |

OTHER PUBLICATIONS

O'Connor, Leo, "Active Magnetic Bearings Give Systems A Lift", Mechanical Engineering, Jul. 1992, vol. 114, No. 7, pp. 52–57.

"A bearing that won't wear out? New design gives engineers a taste of the future—and a way to eliminate friction", Jun. 1992, p. 24 [No Journal Name].

McCarty, Lyle H., "Hybrid Designs Lightens Magnetic Bearings", Design News, Jun. 11, 1990, vol. 46, pp. 156–157.

Leovy, Jill, "Putting a New Spin on Machinery of Future", Los Angeles Times, Nov. 1, 1994, p. 4.

*Primary Examiner*—John D. Lee
*Attorney, Agent, or Firm*—John R. Ross, Esq.

[57] ABSTRACT

An electric discharge gas laser having a laser cavity in which is contained a laser gas and a fan for circulating the laser gas. The fan is supported by an active magnetic bearing system and driven by a brushless DC motor in which the rotor of the motor and at least two magnetic bearings sealed within the gas environment of the laser cavity and the motor stator and the coils of the bearing magnets are located outside the gas environment.

12 Claims, 5 Drawing Sheets

EXCIMER LASER WITH MAGNETIC BEARINGS SUPPORTING FAN

This invention relates to gas lasers and, in particular, to high repetition rate electric discharge gas lasers.

BACKGROUND OF THE INVENTION

Electric Discharge Gas Lasers

Electric discharge gas lasers are well known and have been available since soon after lasers were invented in the 1960s. A high voltage discharge between two electrodes excites a gaseous gain medium. A resonance cavity containing the gain medium permit stimulated amplification of light which is then extracted from the cavity in the form of a laser beam. These electric discharge gas lasers may be operated in a continuous or pulse mode.

Excimer Lasers

Excimer lasers are a particular type of electric gas discharge laser and have been known as such since the mid 1970s. A description of an excimer laser, useful for integrated circuit lithography, is described in U.S. Pat. No. 5,023,884 issued Jun. 11, 1991 entitled "Compact Excimer Laser." This patent has been assigned to Applicants' employer, and the patent is hereby incorporated herein by reference. The excimer laser described in U.S. Pat. No. '884 is a high repetition rate pulse laser. The principal elements of the laser 10 are shown in FIG. 1 which correspond to FIG. 1 in U.S. Pat. No. '884. The discharges 22 are between two long (about 23 inches) electrodes 18 and 20 spaced apart by about ⅝ inch. Repetition rates of prior art lasers, like the one described, are typically within the range of about 100 to 1000 pulses per second. These high repetition rate lasers are usually provided with a gas circulation system which replaces the gas in the region between the electrodes between each pulse. In the above referred to laser, this is done with a long squirrel-cage type fan 46, having blades 48 as shown in FIG. 1 and FIG. 2 which is FIG. 7 in U.S. Pat. No. '884. The fan is slightly longer than the electrodes 18 and 20 and provides sufficient circulation so that at pulse rates between 100 to 1000 Hz, the gas between the electrodes is cleared between pulses. The shaft 130 of fan 46 is supported by two bearings 132 as shown in FIG. 3 which is FIG. 9 of U.S. Pat. No. '884. The gas used in the laser contains fluorine which is extremely reactive. The fan rotor driving fan shaft 130 is sealed, within the same environmental system provided by housing structure members 12 and 14, by sealing member 136 as explained at column 9, line 45 of U.S. Pat. No. '884, and the motor stator 140 is outside sealing member 136 and thus protected from the corrosive action of the fluorine gas. However, bearing 132 is subjected to the corrosive action of the chamber gas as is any lubrication used in the bearing. In addition, bearing lubrication can contaminate the gas.

Magnetic Bearings

Active magnetic bearings have been well known for many years. Such systems were built as early as 1938, and they are used in many industrial applications today. Known advantages of these bearings include long life, reduced maintenance and small bearing losses, and no lubrication is required which eliminates a source of contamination.

A typical prior art active radial bearing is described in FIG. 4. Sensor 2 senses the position of soft iron rotor 4 and sends a signal to controller 6 which controls the current in electromagnet 8 with power amplifier 10 in order to produce the precise magnetic field needed to balance rotor 4 in a desired position.

What is Needed

There is a need to increase the pulse repetition of gas discharge lasers, including the type of excimer lasers described in U.S. Pat. No. '884 and a corresponding need for higher fan speed. This increases the burden of fan shaft bearings, requiring better bearings and more powerful fan motors. There is also the need to reduce sources of contamination in high repetition rate gas discharge lasers.

SUMMARY OF THE INVENTION

The present invention provides an electric discharge gas laser having a laser cavity in which is contained a laser gas and a fan for circulating the laser gas. The fan is supported by an active magnetic bearing system and driven by a brushless DC motor in which the rotor of the motor and the rotors of at least two bearings are sealed within the gas environment of the laser cavity and the motor stator and the coils of the bearing magnets are located outside the gas environment.

DETAILED DESCRIPTION OF PREFERRED EMBODIMENT

Preferred embodiments of the present invention can be described by reference to the drawings.

Figure 1:
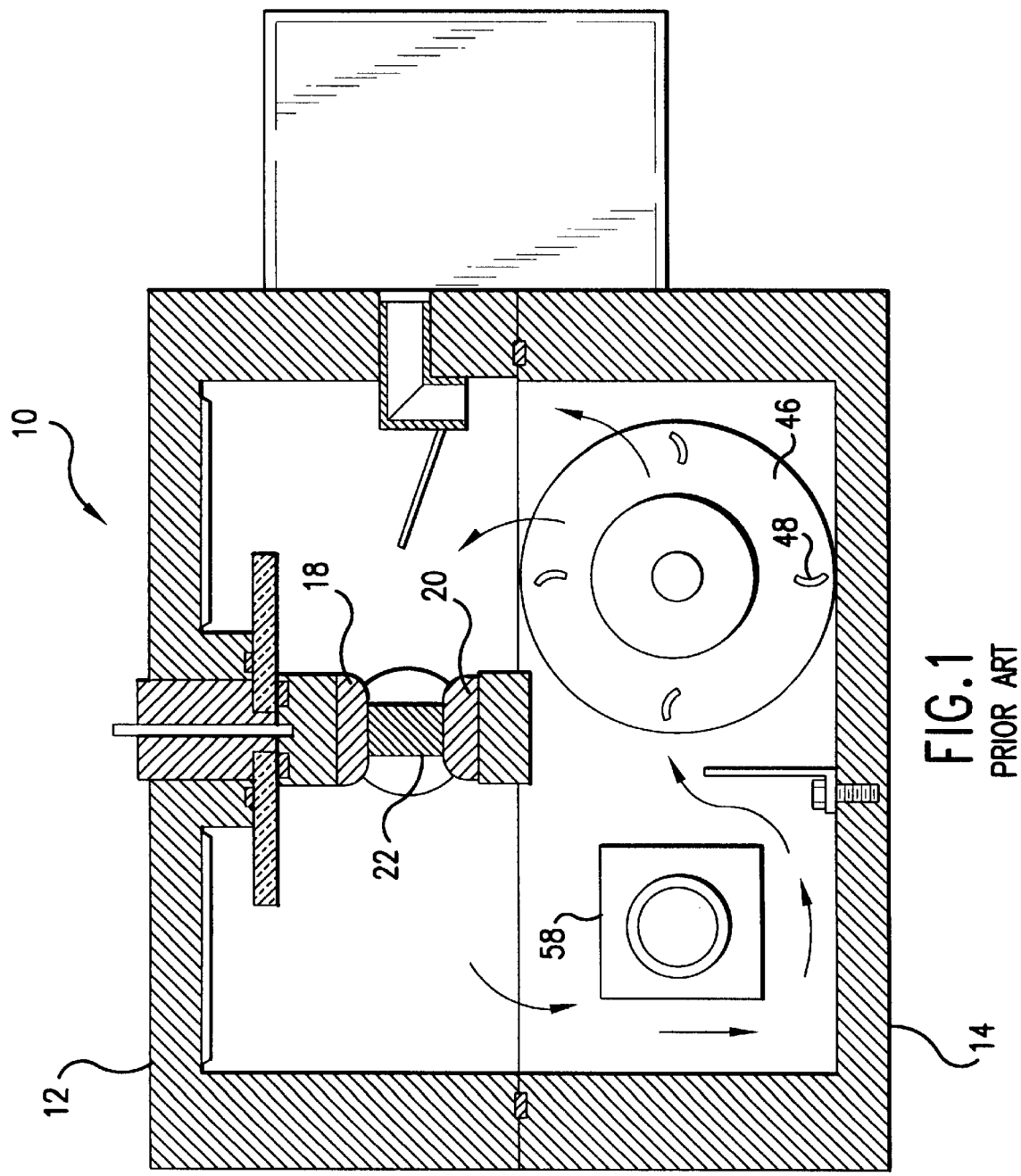
FIG. 1 shows a prior art laser system.
Figure 2:
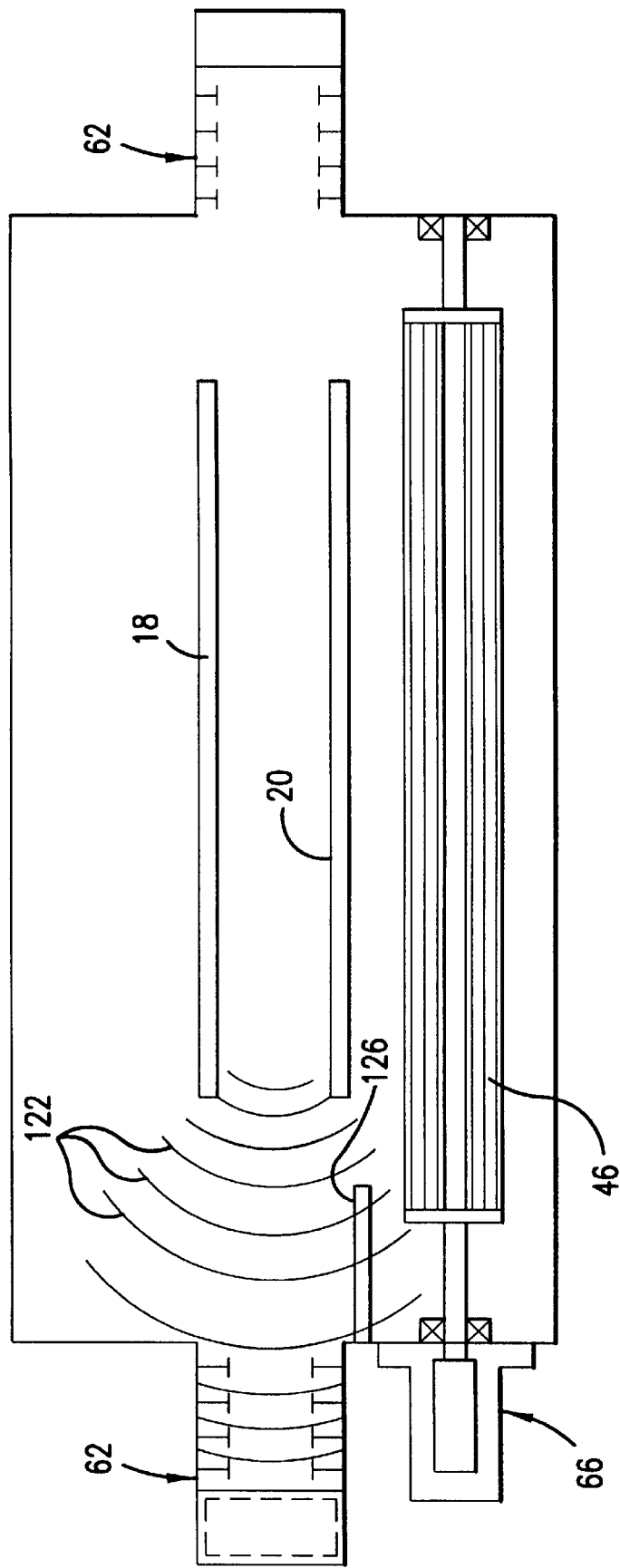
FIG. 2 shows the location of a squirrel cage fan in the FIG. 1 laser.
Figure 3:
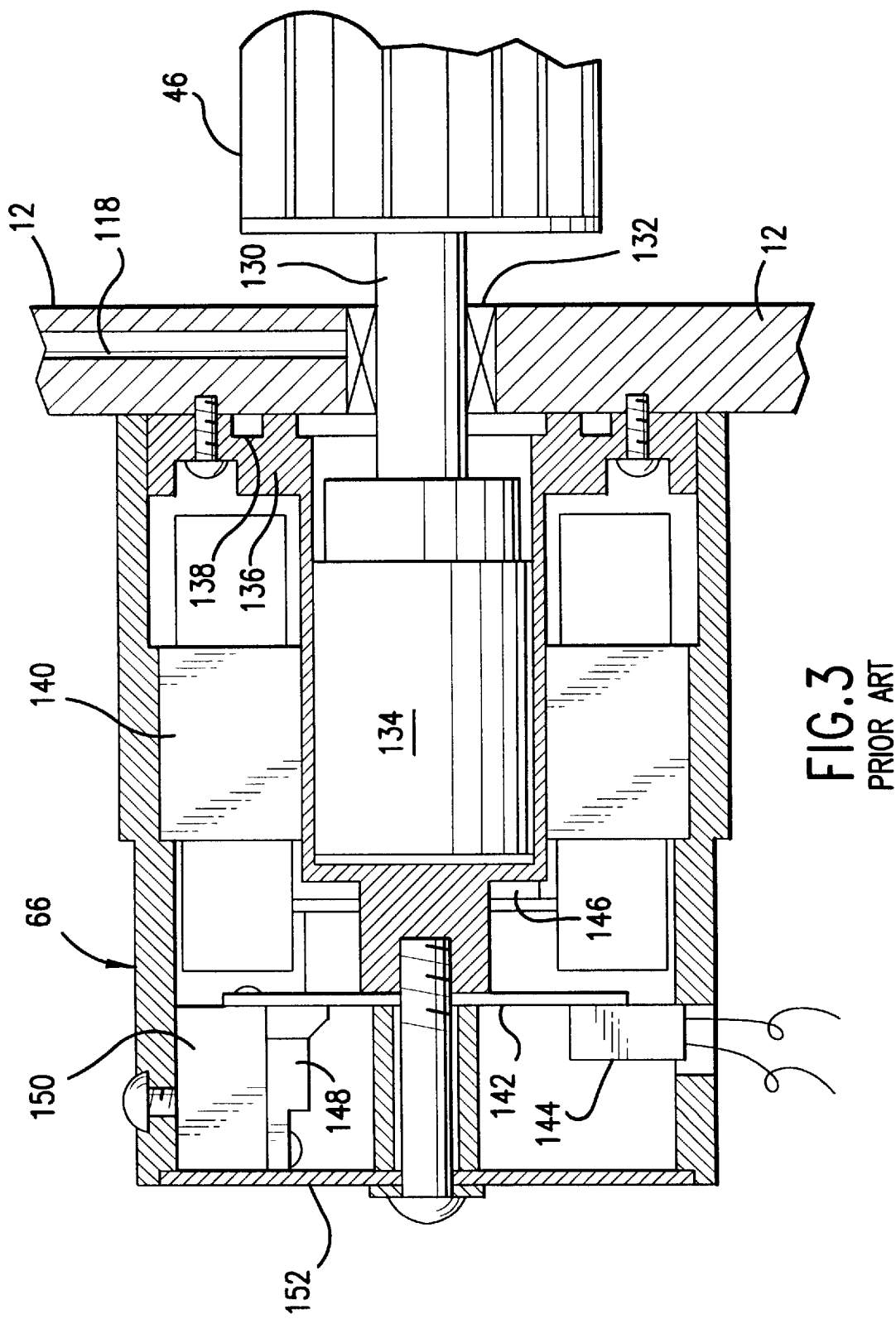
FIG. 3 shows a brushless DC motor for driving the fan.
Figure 4:
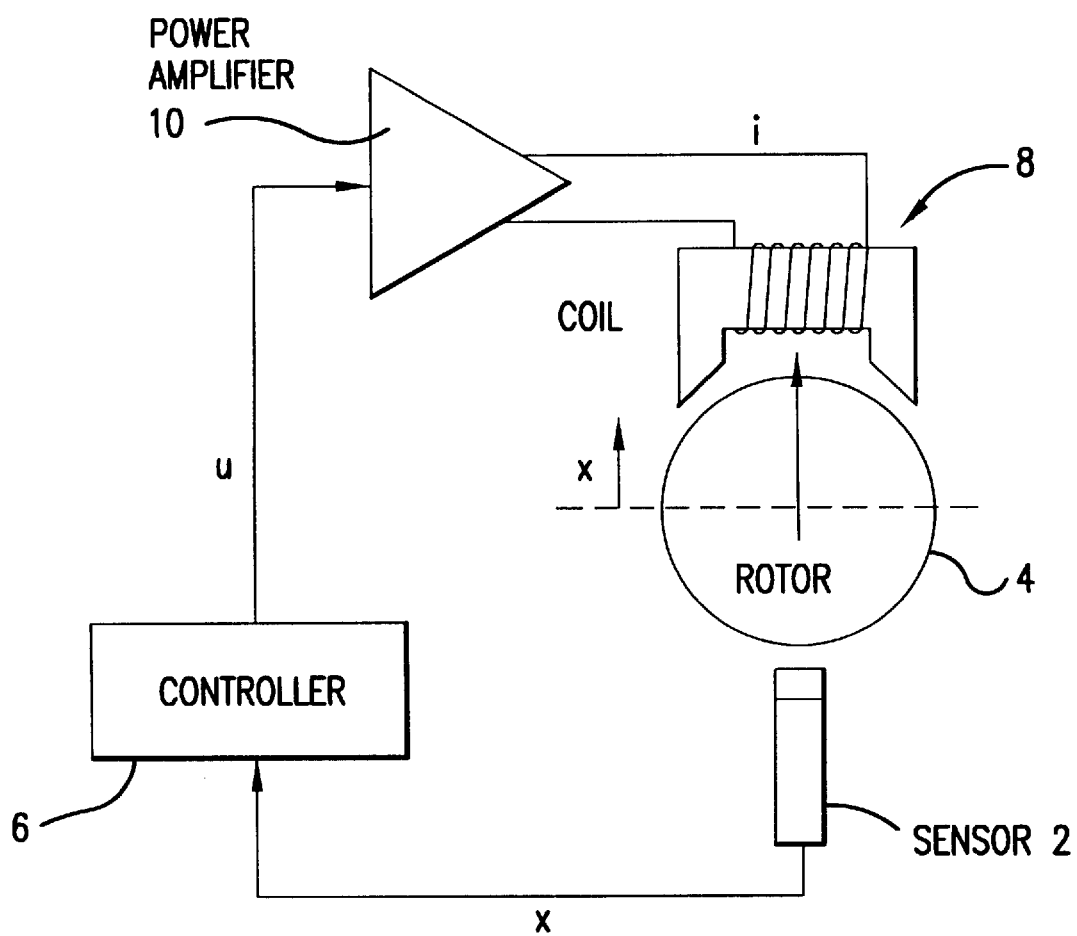
FIG. 4 demonstrates the functioning of a prior art active radial magnetic bearing system.
Figure 5:
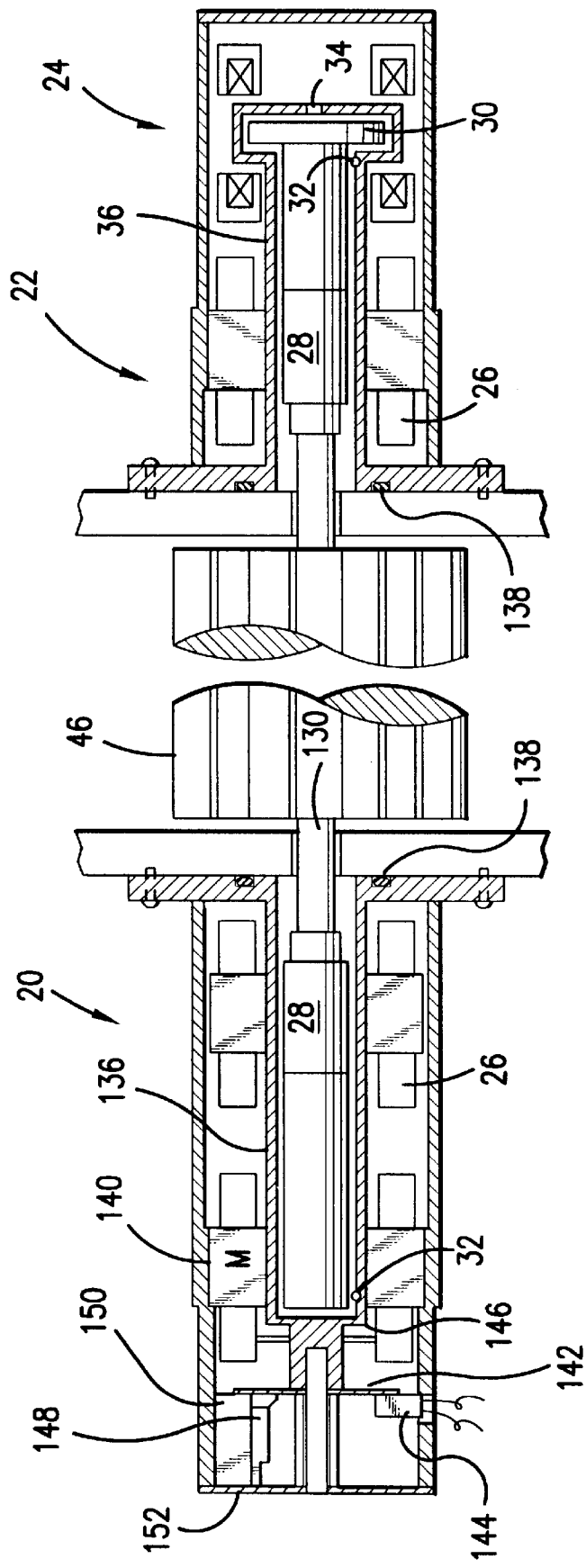
FIG. 5 is a drawing of a preferred embodiment of the present invention.

FIG. 5 is a drawing showing important features of a preferred embodiment of the present invention. This drawing shows a fan system for gas circulation of an excimer laser of the type described in detail in U.S. Pat. No. '884. This gas is comprised of fluorine, a buffer gas, neon, and a noble gas which could be either krypton or argon. As in the prior art unit, rotor 134 is located on the end of shaft 130, with rotor 134 driving shaft 130, and thereby 26-inch fan 46, the central portion of which has been sectioned out in FIG. 5. Surrounding the end of rotor 134 and sealing member 136 is stator 140 which is a series of windings. The stator 140 and rotor 134 together form a brushless DC motor which operates basically in the normal manner. The major difference between a normal brushless DC motor and this motor is the use of sealing member 136 located between the stator and the rotor so that the rotor is sealed relative to the stator 140. This arrangement permits the DC motor to drive fan 46 without the use of a rotating seal in the same manner as described in U.S. Pat. No. '884. The motor also includes circuit board 142, power input connection 144, and a Hall detector 146 as explained in U.S. Pat. No. '884.

This embodiment of the present invention includes two radial magnetic bearings 20 and 22 supporting each end of shaft 130 of fan 46. The axial positioning of shaft 130 is provided by thrust bearing system 24. Radial bearings 20 and 22 each consist of four electromagnets 26 (two of which are shown in FIG. 5). Preferably the electromagnets are positioned at radial positions of 45°, 135°, 225° and 315°. The rotor 28 and stator elements are made of soft laminated iron. In fact, the electromagnets are very similar to the brushless DC motor discussed above. However, the function of the electromagnets is to hold the fan shaft in its proper radial position rather than rotate it. The electromagnets are preferably energized with a constant bias current (about half the maximum current which is symmetrically perturbed by a control current to produce dynamic control force). The fixed bias current provides a linearization of the magnetic forces produced by the bearings. Radial position sensors 32, 90° apart, aligned with the electromagnets provide position information to a control unit (not shown) which controls the current to the electromagnets in accordance with well known techniques. Thrust bearing system 24 provides the axial stability for shaft 130. The thrust bearing in this embodiment consist of two coils each applying attractive force to soft iron tab-unit 30 based on position information provided to the control unit (not shown) by axial position sensor 34.

The rotor cavities at both ends of the fan shaft 130 are sealed by sealing members 136 and 36 and O-ring seals 138. Thus, the windings of motor unit 140 and electromagnets in bearings 20, 22 and 24 are protected from the corrosive fluorine gas in the laser chamber. In this preferred embodiment, the fan is a 26" long axial monolithic fan made from 9 identical cylindrical (hollow) segments of 2.3" long. Each segment is made of two rings/flanges with 3.75" OD and 2.75" ID. Between these rings lies 23 vanes/blades around 360°. The vanes are 2.3" long, 0.5" wide (curved) and 0.03" thick. The fan is made with aluminum alloy and weighs 1.5 lbs. Final weight for other considerations may go up to 2.0 lbs. The preferred speed of the fan is 3300 RPM to 5000 RPM.

The fan operates at speeds of 3000 RPM to 5000 RPM in a laser gas environment with a fluorine content of about 0.1% at temperatures of about 60° C. With these bearings, the inventors expect at least 30,000 hours of trouble-free operation with a 95% confidence level and 10,000 hours of operation with a 99% confidence level.

Advantages of the present invention over the prior art ball bearing supported fan are many. There is a substantial increase in bearing life. The active control of the magnet bearings of rotor position substantially eliminate vibration. Lubrication contamination problems are eliminated. The need for careful balancing of the fan is avoided.

Prior art blowers typically operate at a constant speed such as 3800 RPM. The present invention will operate at speeds up to 5000 RPM or greater. In a preferred operating mode, the speed is continuously or periodically automatically cycled, for example, from 4000 RPM to 5000 RPM, in order to provide better mixing of the chamber gas. Automatic cycling of fan speed may also be utilized to avoid buildup of oscillations in the long fan.

The speed of the fan can also be controlled, if necessary, from the information sent by a strategically located sensor to the controller. This is helpful if and when the rotating fan parts come too close to the parts of other components in the chamber. Although there are many other reasons to control and/or vary the speed of the fan, the one to reduce/control the effects of acoustic and/or shock waves are of significant importance in laser operations.

While the invention has been described in connection with what is presently considered to be the preferred embodiments, it is to be understood that the invention is not limited to the disclosed embodiments, but on the contrary, covers various modifications and equivalents included within the spirit and scope of the following claims. For example, we have shown only one example of radial active magnetic bearings. Many alternate magnetic bearing designs are well known and can be adopted to gas discharge lasers using the concept disclosed herein. For example, radial bearings are available which also provide axial control which would eliminate the need for thrust bearings. Therefore, persons of ordinary skill in this field are to understand that all such equivalents are included within the scope of the claims.

That which is claimed is:

1. An electric discharge gas laser comprising
    A. a housing structure having walls forming an internal laser cavity;
    B. a gas located within the laser cavity, said gas being capable of lasing action;
    C. a pair of elongated spaced electrodes located within the laser cavity and forming an electrical discharge region between the electrodes for stimulating gas within the discharge region to lasing action in accordance with an electrical discharge between the electrodes;
    D. a rotating fan having a shaft located within the laser cavity for circulating the gas through the discharge region;
    E. a brushless DC motor comprising a stator and a rotor for providing rotation to the fan;
    F. at least two magnetic bearings, each comprising stator and a rotor and position sensors for providing radial support to said shaft;
    G. said rotors of said motor and said at least two magnetic bearings, each being coupled directly or indirectly to said shaft; and
    H. at least one sealing member interposed between said rotors and said stators to enclose said rotors with said sealing member sealed to the housing structure to have said rotors effectively sealed within the gas environment and the stators without the gas environment.

2. A laser as in claim 1 wherein at least one of said at least two magnetic bearings is a thrust bearing.

3. A laser as in claim 2 wherein at least one of said at least two magnetic bearings is a radial bearing.

4. A laser as in claim 3 and further comprising an electronic fan control unit providing high speed active control to said radial magnetic bearings.

5. A laser as in claim 3 and further comprising an electronic fan control unit providing high speed active control to said radial magnetic bearings and active control to said thrust bearing system and active control to said motor.

6. A laser as in claim 5 wherein said control unit is programmed to operate said fan at periodically varying speeds.

7. A laser as in claim 1 wherein at least one of said magnetic bearings is a conical bearing.

8. A laser as in claim 1 wherein said at least two magnetic bearings are two conical bearings.

9. A laser as in claim 1 wherein said at least two magnetic bearings are two radial bearings and two thrust bearings.

10. A laser as in claim 1 wherein said gas comprises a halogen and a noble gas and a buffer gas to provide an excimer laser.

11. A laser as in claim 10 wherein said halogen is fluorine, said buffer gas is neon and said noble gas is krypton or argon.

12. A laser as in claim 1 and further comprising a control unit programmed to minimize acoustic and/or shock wave disturbances within the gas.

* * * * *